United States Patent
Dai et al.

(10) Patent No.: US 8,437,131 B2
(45) Date of Patent: May 7, 2013

(54) ELECTRONIC DEVICE HOUSING AND MANUFACTURING METHOD THEREOF

(75) Inventors: Bin Dai, ShenZhen (CN); Fa-Guang Shi, Shenzhen (CN)

(73) Assignees: Fu Tai Hua Industry (Shenzhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 232 days.

(21) Appl. No.: 12/965,853

(22) Filed: Dec. 11, 2010

(65) Prior Publication Data
US 2012/0033356 A1    Feb. 9, 2012

(30) Foreign Application Priority Data
Aug. 9, 2010  (CN) .......................... 2010 1 0248394

(51) Int. Cl.
*H05K 5/00*  (2006.01)
*H05K 7/00*  (2006.01)
*H04M 1/00*  (2006.01)

(52) U.S. Cl.
USPC .............. 361/679.55; 361/679.3; 361/679.56; 455/575.8; 312/223.2

(58) Field of Classification Search .............. 361/679.01, 361/679.02, 679.08, 679.09, 679.3, 679.55–679.59; 174/535; 455/325, 556.1, 550.1, 90.1, 575.1
See application file for complete search history.

(56) References Cited

U.S. PATENT DOCUMENTS
2010/0061040 A1* 3/2010 Dabov et al. .............. 361/679.01
* cited by examiner

*Primary Examiner* — Zachary M Pape
*Assistant Examiner* — Jerry Wu
(74) *Attorney, Agent, or Firm* — Altis Law Group, Inc.

(57) ABSTRACT

An electronic device housing includes a bottom housing, a support frame, and a plastic side frame. The support frame is fixed on the bottom housing. The support frame defines a positioning groove in an edge. The plastic side frame is partially embedded in the positioning groove of the support frame. A method of manufacturing an electronic device housing is also provided.

12 Claims, 5 Drawing Sheets

ELECTRONIC DEVICE HOUSING AND MANUFACTURING METHOD THEREOF

CROSS-REFERENCE TO RELATED APPLICATIONS

This application is related to one co-pending U.S. patent application, which is: application Ser. No. 12/965,856, and entitled "ELECTRONIC DEVICE HOUSING AND MANUFACTURING METHOD THEREOF". Such application has the same assignee as the instant application and are concurrently filed herewith. The disclosure of the above-identified application is incorporated herein by reference.

BACKGROUND

1. Technical Field

The present disclosure relates generally to electronic device housings and, more particularly, to an electronic device housing formed by injection molding.

2. Description of Related Art

Referring to FIG. 5, an electronic device housing 10 includes a bottom housing 11, a top cover 12, and a side frame 13. The periphery of the top cover 12 is welded to the bottom housing 11. The top cover 12 defines an assembly groove (not labeled). The side frame 13 is positioned in the assembly groove of the top cover 12. An adhesive layer is positioned between the side frame 13 and the top cover 12, thereby fixing the side frame 13 to the top cover 12.

However, during manufacture, the top cover 12 is welded to the bottom housing 11, and the side frame 13 is adhered to the top cover 12. Therefore, a process for manufacturing the electronic device housing 10 is complicated. In addition, a welding portion between the top cover 12 and the bottom housing 11 may experience discoloration after polishing, thus negatively affecting the electronic device appearance.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
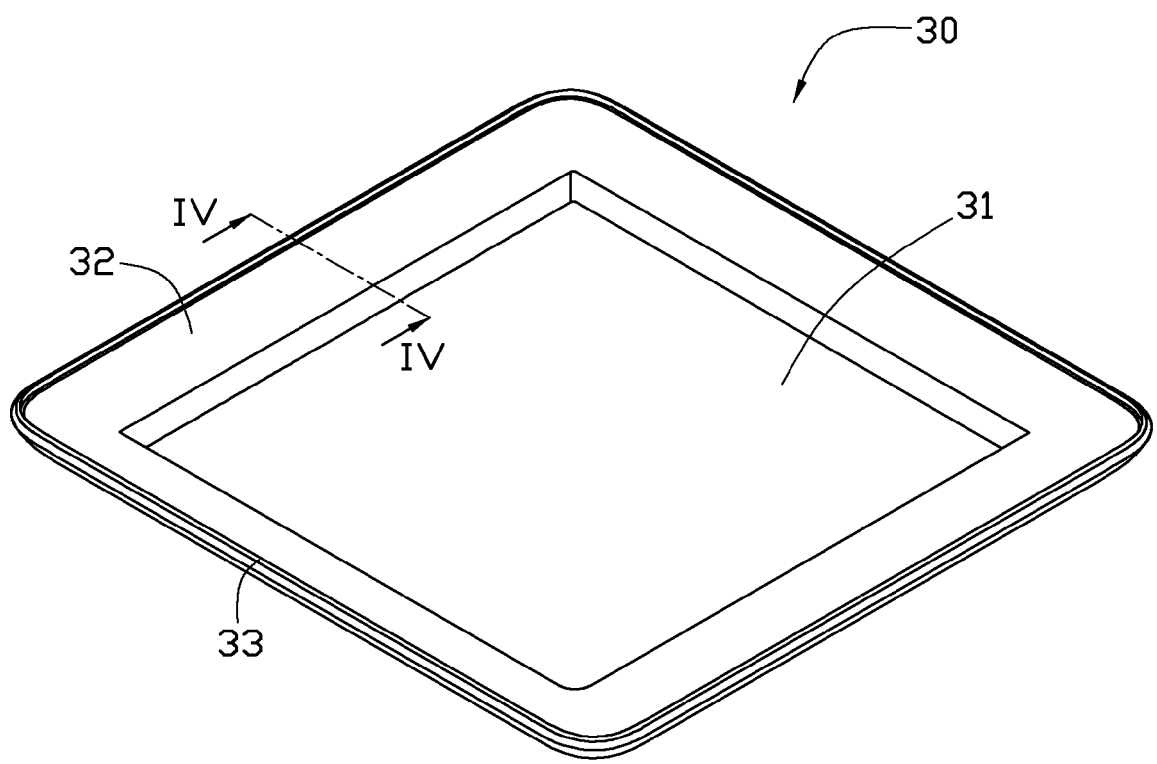
FIG. 1 is an isometric view of an embodiment of an electronic device housing including a bottom housing, a support frame, and a plastic side frame.

Referring to FIG. 1, an embodiment of an electronic device housing 30 includes a bottom housing 31, a support frame 32, and a plastic side frame 33.

Figure 2:
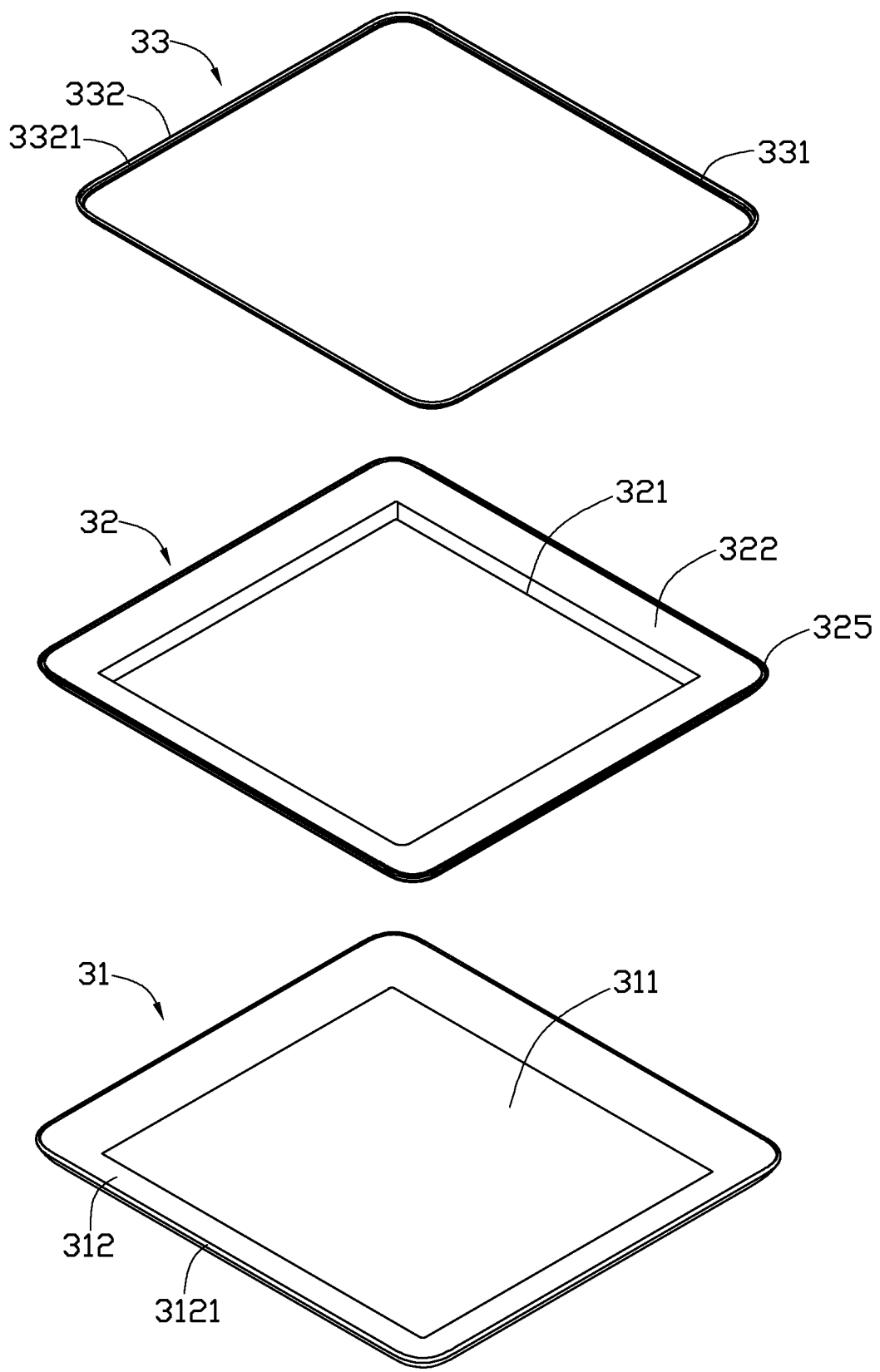
FIG. 2 an exploded, isometric view of the electronic device housing of FIG. 1.
Figure 3:
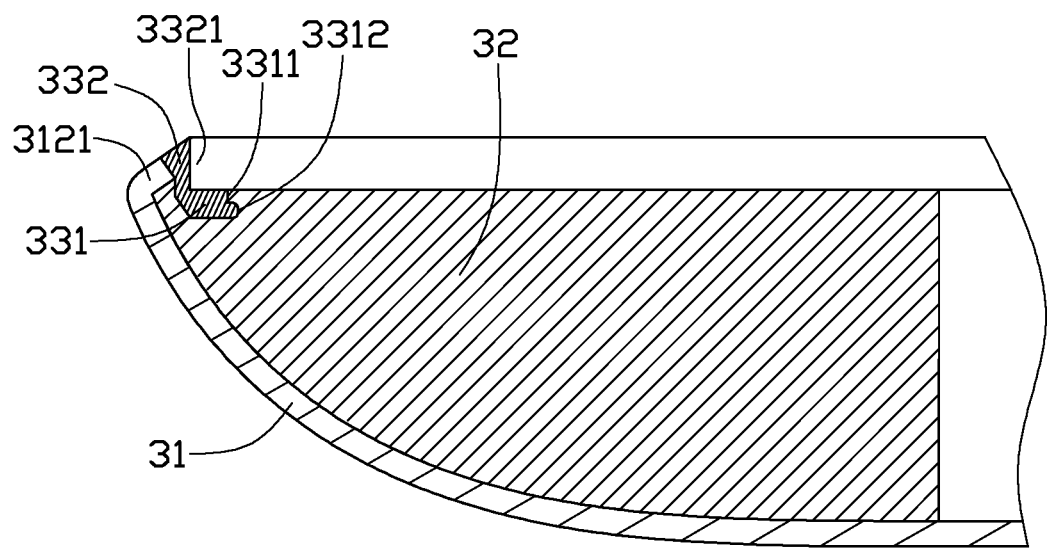
FIG. 3 is a partial cross-section of the electronic device housing of FIG. 1, taken along line IV-IV.
Figure 4:
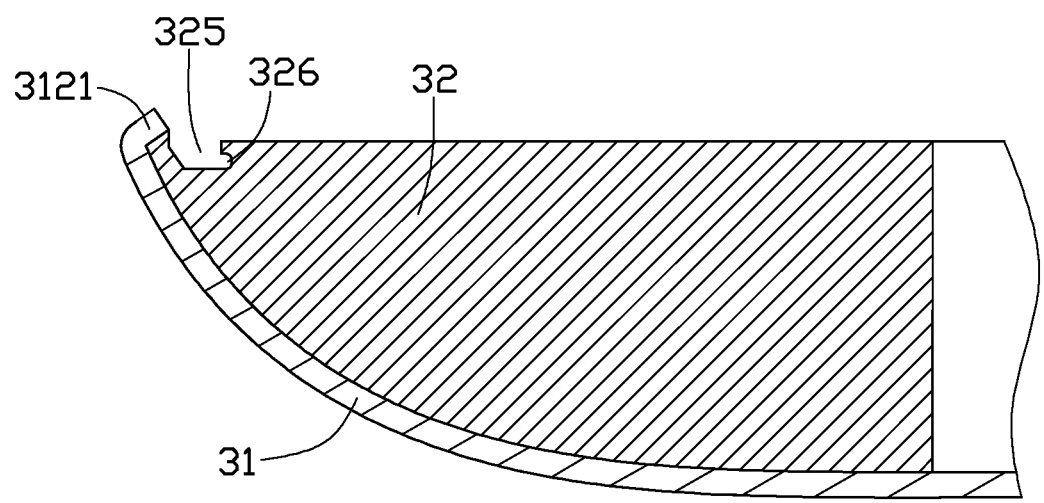
FIG. 4 is similar to FIG. 3, but without the plastic side frame.
Figure 5:
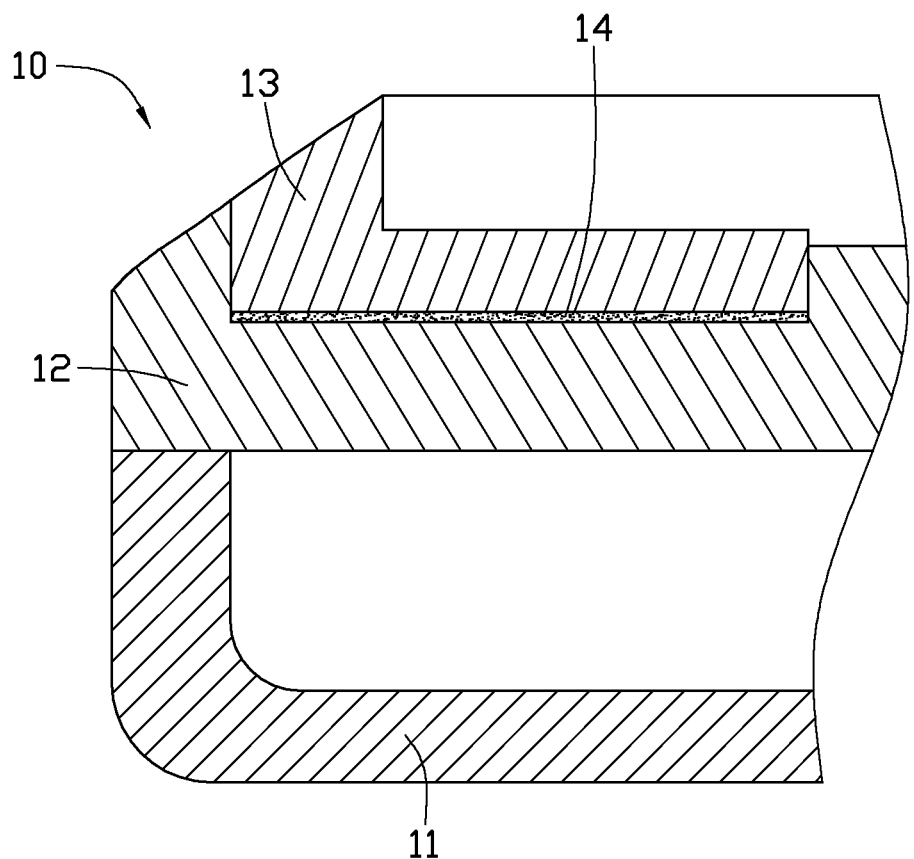
FIG. 5 is an isometric view of a commonly used electronic device housing.

Referring to FIGS. 2 through 4, the bottom housing 31 includes a base plate 311 and a sidewall 312 extending from an edge of the base plate 311. The sidewall 312 forms a connecting portion 3121 at a top end thereof. In the illustrated embodiment, the base plate 311 is rectangular, and the sidewall 312 is substantially curved. The connecting portion 3121 is a substantially rectangular ring.

The support frame 32 is fixed to the bottom housing 31. A bottom surface 321 of the support frame 32 is attached to an inner surface of the sidewall 312. The connecting portion 3121 is fastened to an edge of a top surface 322 of the support frame 32. The support frame 32 further defines a positioning groove 325 in an edge of the top surface 322. In the illustrated embodiment, the support frame 32 is riveted to the bottom housing 31. The support frame 32 is rectangular. The positioning groove 325 is formed by milling. The inner surface of the positioning groove 325 is curved, and defines a receiving groove 326 therein.

The plastic side frame 33 includes an engaging portion 331 and an assembly portion 332 extending from an end of the engaging portion 331. The engaging portion 331 is embedded in the positioning groove 325 of the support frame 32. The engaging portion 331 connects the support frame 32 with a curved surface 3311. The assembly portion 332 is connected to the connecting portion 3121 of the bottom housing 31. The assembly portion 332 defines an assembly groove 3321 to receive a display panel or other components (not shown). In the illustrated embodiment, the engaging portion 331 forms a restricting protrusion 3312 received in the receiving groove 326 of the support frame 32, thereby increasing a connecting strength between the plastic side frame 33 and the support frame 32.

A method of manufacturing the electronic device housing 30 is as follows. First, the bottom housing 31 and the support frame 32 are provided, and the support frame 32 is fixed on the bottom housing 31. In the illustrated embodiment, the support frame 32 is riveted to the bottom housing 31. Second, a positioning groove 325 is formed in the support frame 32 by milling. Third, molten plastic material is injected towards the positioning groove 325 of the support frame 32. In the illustrated embodiment, the bottom housing 31 and the support frame 32 are positioned together in an injection mold (not shown), and the molten plastic material is injected towards the positioning groove 325. The molten plastic material cools down and then forms the plastic side frame 33 on the support frame 32.

As described, in the manufacturing method of the electronic device housing 30, no welding of the bottom housing 31 and the support frame 32 nor polishing of a welding portion of the bottom housing 31 and the support frame 32 is needed, thus the electronic device housing 30 is more easily manufactured with optimal appearance. In addition, the plastic side frame 33 connects the support frame 32 with the curved surface 3311, thus enhancing a connecting strength of the electronic device housing 30.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device housing, comprising:
   a bottom housing comprising a base plate and a sidewall extending from an edge of the base plate, the sidewall forming a connecting portion at a top end thereof;
   a support frame fixed on the bottom housing, the support frame comprising a top surface, and defining a positioning groove in an edge of the top surface; and
   a plastic side frame, wherein the connecting portion is fastened to the edge of the top surface of the support frame, the plastic side frame comprises an engaging portion and an assembly portion extending from an end of the engaging portion, the engaging portion is embedded in the positioning groove of the support frame, and the assembly portion is connected to the connecting portion of the bottom housing without a gap.

2. The electronic device housing of claim 1, wherein the engaging portion is connected to the support frame without a gap.

3. The electronic device housing of claim 1, wherein the plastic side frame connects the connecting portion of the bottom housing.

4. The electronic device housing of claim 1, wherein the plastic side frame connects the support frame with a curved surface.

5. The electronic device housing of claim 1, wherein the support frame further defines a receiving groove in a curved inner surface of the positioning groove; the engaging portion forms a restricting protrusion received in the receiving groove of the support frame.

6. The electronic device housing of claim 1, wherein the assembly portion defines an assembly groove.

7. A method of manufacturing an electronic device housing, comprising:
   providing a bottom housing and a support frame, and fixing the support frame on the bottom housing, the bottom housing comprising a base plate and a sidewall extending from an edge of the base plate, the sidewall forming a connecting portion at a top end thereof, the support frame comprising a top surface;
   forming a positioning groove in the top surface of the support frame;
   injecting a molten plastic material towards the positioning groove of the support frame; and
   cooling the molten plastic material to form a plastic side frame on the support frame, the plastic side frame comprising an engaging portion and an assembly portion extending from an end of the engaging portion, the engaging portion being embedded in the positioning groove of the support frame, and the assembly portion connecting to the connecting portion of the bottom housing without a gap.

8. The method of claim 7, wherein the engaging portion is connected to the support frame without a gap.

9. The method of claim 7, wherein the plastic side frame connects the connecting portion of the bottom housing.

10. The method of claim 7, wherein the plastic side frame connects the support frame with a curved surface.

11. The method of claim 7, wherein the support frame further defines a receiving groove in a curved inner surface of the positioning groove; the engaging portion forms a restricting protrusion received in the receiving groove of the support frame.

12. The method of claim 7, wherein the assembly portion defines an assembly groove.

\* \* \* \* \*